United States Patent
Tanaka et al.

(10) Patent No.: US 9,339,775 B2
(45) Date of Patent: May 17, 2016

(54) CHEMICAL-LIQUID MIXING METHOD AND CHEMICAL-LIQUID MIXING APPARATUS

(71) Applicant: TOKYO ELECTRON LIMITED, Tokyo-To (JP)

(72) Inventors: Hiroshi Tanaka, Tosu (JP); Koukichi Hiroshiro, Tosu (JP); Fumihiro Kamimura, Tosu (JP)

(73) Assignee: TOKYO ELECTRON LIMITED, Tokyo-To (JP)

( * ) Notice: Subject to any disclaimer, the term of this patent is extended or adjusted under 35 U.S.C. 154(b) by 0 days.

(21) Appl. No.: 14/750,319

(22) Filed: Jun. 25, 2015

(65) Prior Publication Data

US 2015/0290599 A1    Oct. 15, 2015

Related U.S. Application Data

(62) Division of application No. 11/882,402, filed on Aug. 1, 2007.

(30) Foreign Application Priority Data

Aug. 3, 2006    (JP) ................................ 2006-211732

(51) Int. Cl.
*B01F 5/10*    (2006.01)
*B01F 3/08*    (2006.01)
(Continued)

(52) U.S. Cl.
CPC . *B01F 5/10* (2013.01); *B01F 3/088* (2013.01); *B01F 3/0861* (2013.01);
(Continued)

(58) Field of Classification Search
CPC ............................. H01L 21/67057; B01F 5/10

USPC ........................................ 366/132, 136, 137
See application file for complete search history.

(56) References Cited

U.S. PATENT DOCUMENTS 3,870,783 A    3/1975    Hall et al.
5,069,235 A    12/1991   Vetter et al.
(Continued)

FOREIGN PATENT DOCUMENTS

EP    0 477 504    4/1992
EP    0 618 612    10/1994
(Continued)

OTHER PUBLICATIONS

European Search Report corresponding to European Patent Application No. 07015193.1-2307, dated Oct. 30, 2007.

*Primary Examiner* — David Sorkin
*Assistant Examiner* — Abbas Rashid
(74) *Attorney, Agent, or Firm* — Smith, Gambrell & Russell, LLP (57) ABSTRACT

The present invention provides a chemical-liquid mixing method and a chemical-liquid mixing apparatus capable of sufficiently generating a peroxornonosulfuric acid that is effective in removing a resist from a substrate, when a sulfuric acid and a hydrogen peroxide solution are mixed with each other. At first, an inner tank 10 is filled up with a sulfuric acid and the sulfuric acid overflowing from the inner tank 10 is allowed to flow into an outer tank 12. Then, a hydrogen peroxide solution is supplied into the inner tank 10 and the hydrogen peroxide solution is allowed to flow into the outer tank 12 whereby the two kinds of liquids of the hydrogen peroxide solution and the sulfuric acid are stored in the outer tank 12. Simultaneously when the hydrogen peroxide solution flows into the outer tank 12, a return pump 16 is activated.

5 Claims, 6 Drawing Sheets

(51) Int. Cl.
  *B01F 15/00* (2006.01)
  *B01F 15/04* (2006.01)
  *C01B 15/08* (2006.01)
  *C11D 3/39* (2006.01)
  *C11D 11/00* (2006.01)
  *H01L 21/67* (2006.01)
  *B01F 15/02* (2006.01)
  *B01F 15/06* (2006.01)

(52) U.S. Cl.
  CPC ........ *B01F 3/0865* (2013.01); *B01F 15/00253* (2013.01); *B01F 15/00331* (2013.01); *B01F 15/0243* (2013.01); *B01F 15/0412* (2013.01); *B01F 15/0437* (2013.01); *B01F 15/06* (2013.01); *C01B 15/08* (2013.01); *C11D 3/3947* (2013.01); *C11D 11/0047* (2013.01); *H01L 21/67057* (2013.01); *B01F 2015/062* (2013.01)

(56) References Cited

U.S. PATENT DOCUMENTS

| | | | |
|---|---|---|---|
| 5,159,946 A * | 11/1992 | Seiichiro | 134/182 |
| 5,227,001 A | 7/1993 | Tamaki et al. | |
| 5,294,570 A | 3/1994 | Fleming, Jr. et al. | |
| 5,327,921 A | 7/1994 | Mokuo et al. | |
| 5,505,785 A | 4/1996 | Ferrell | |
| 5,571,367 A * | 11/1996 | Nakajima et al. | 156/345.15 |
| 5,593,505 A | 1/1997 | Erk et al. | |
| 5,626,159 A | 5/1997 | Erk et al. | |
| 5,722,441 A | 3/1998 | Teramoto | |
| 5,740,053 A | 4/1998 | Iwama | |
| 5,780,363 A | 7/1998 | Delehanty et al. | |
| 5,804,516 A * | 9/1998 | Hsu et al. | 438/745 |
| 5,816,274 A | 10/1998 | Bartram et al. | |
| 5,820,688 A | 10/1998 | Köppl et al. | |
| 5,885,403 A | 3/1999 | Cheng | |
| 5,888,344 A | 3/1999 | Ogami et al. | |
| 5,904,157 A | 5/1999 | Meseha et al. | |
| 6,055,995 A | 5/2000 | Miyazawa | |
| 6,199,563 B1 | 3/2001 | Uehara et al. | |
| 6,241,827 B1 | 6/2001 | Tanaka et al. | |
| 6,277,205 B1 | 8/2001 | Nagamura et al. | |
| 6,357,458 B2 | 3/2002 | Tanaka et al. | |
| 6,391,067 B2 | 5/2002 | Yanagita et al. | |
| 6,399,517 B2 | 6/2002 | Yokomizo et al. | |
| 6,539,963 B1 | 4/2003 | Dunn | |
| 6,584,989 B2 | 7/2003 | Taft et al. | |
| 6,612,316 B2 | 9/2003 | Kawaguchi | |
| 6,637,445 B2 | 10/2003 | Ogasawara et al. | |
| 2001/0011548 A1 | 8/2001 | Tanaka et al. | |
| 2002/0001967 A1 | 1/2002 | Yokomizo et al. | |
| 2002/0148485 A1 | 10/2002 | Taft et al. | |
| 2003/0209069 A1 * | 11/2003 | Tung et al. | 73/290 R |
| 2004/0000330 A1 * | 1/2004 | Kwon et al. | 134/102.2 |
| 2004/0035449 A1 | 2/2004 | Nam | |
| 2006/0130880 A1 * | 6/2006 | Nagami | 134/26 |
| 2006/0237437 A1 * | 10/2006 | Ryu et al. | 219/497 |
| 2007/0095363 A1 * | 5/2007 | Tomita et al. | 134/2 |
| 2008/0178910 A1 | 7/2008 | Hiroshiro et al. | |

FOREIGN PATENT DOCUMENTS

| | | |
|---|---|---|
| JP | 5-166780 | 7/1993 |
| JP | 2000-319689 | 11/2000 |

* cited by examiner

CHEMICAL-LIQUID MIXING METHOD AND CHEMICAL-LIQUID MIXING APPARATUS

FIELD OF THE INVENTION

The present invention relates to a chemical-liquid mixing method for mixing a sulfuric add and a hydrogen peroxide solution, and a chemical-liquid mixing apparatus therefor. In particular, it pertains to a chemical-liquid mixing method and chemical-liquid mixing apparatus capable of generating an enough peroxomonosulfuric add that is effective in removing a resist from a substrate, when a sulfuric acid and a hydrogen peroxide solution are mixed with each other.

BACKGROUND ART

There has been conventionally known a method of cleaning substrates such as semiconductor wafers (also referred to as "wafer" below) with the use of a mixture liquid of a sulfuric acid and a hydrogen peroxide solution as a cleaning liquid (see, JP5-166780A, for example). To be specific, a wafer is cleaned by fully decomposing a resist adhered to the wafer, by means of a peroxomonosulfuric acid ($H_2SO_5$) which has been generated by mixing a sulfuric acid and a hydrogen peroxide solution (this theory will be described below).

Figure 6:
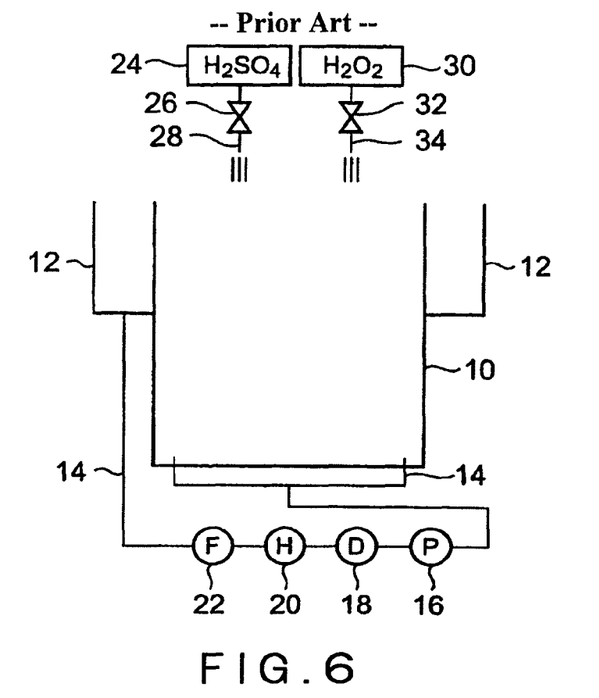
FIG. 6 is a schematic structural view showing a structure of a conventional chemical-liquid mixing apparatus.

With reference to FIG. 6, a chemical-liquid mixing apparatus for producing a mixture liquid of a sulfuric acid and a hydrogen peroxide solution is described. FIG. 6 is a schematic structural view showing a structure of a general chemical-liquid mixing apparatus.

As shown in FIG. 6, the general chemical-liquid mixing apparatus includes an inner tank 10 in which a wafer is accommodated to be cleaned, and an outer tank 12 disposed around a circumference of the inner tank 10, into which a liquid overflowing from the inner tank 10 flows. There is disposed a return pipe 14 for returning a liquid in the outer tank 12 into the inner tank 10. In the return pipe 14, there are serially arranged a return pump 16 for sending a liquid in the outer tank 12 to the inner tank 10, a dumper 18 for reducing vibrations or the like of the return pipe 14, a heater 20 for heating a liquid passing through the return pipe 14, and a filter 22 for filtering a liquid passing through the return pipe 14. The chemical-liquid mixing apparatus also includes a sulfuric-acid storage tank 24 for storing a sulfuric acid ($H_2SO_4$), and a hydrogen-peroxide-solution storage tank 30 for storing a hydrogen peroxide ($H_2O_2$) solution. The sulfuric acid and the hydrogen peroxide solution stored in the respective storage tanks 24 and 30 are supplied into the inner tank 10 by a sulfuric-acid supply pipe 28 and a hydrogen-peroxide-solution supply pipe 34, respectively. Supply operations of the respective chemical liquids can be adjusted by a sulfuric-acid supply valve 26 and a hydrogen-peroxide-solution supply valve 32, respectively.

Next, a method of producing a mixture liquid by such a chemical-liquid mixing apparatus will be described below. The inner tank 10 and the outer tank 12 are empty in their initial states.

At first, the sulfuric-acid supply valve 26 and the hydrogen-peroxide-solution supply valve 32 are opened, while the return pump 16 and the heater 20 are left OFF, so as to simultaneously supply a sulfuric acid and a hydrogen peroxide solution from the sulfuric-acid storage tank 24 and the hydrogen-peroxide-solution storage tank 30 into the inner tank 10. For example, a supply ratio between the sulfuric acid and the hydrogen peroxide solution is 5:1. Namely, a supply rate of the sulfuric acid is, e.g., 25 liters/min, and a supply rate of the hydrogen peroxide solution is, e.g., 5 liters/min. The reason why the supply rate of the sulfuric acid is considerably larger than that of the hydrogen peroxide solution is described below. The supply of the sulfuric acid and the hydrogen peroxide solution is continued until the inner tank 10 becomes full and the liquid overflows to the outer tank 12.

By supplying the sulfuric acid and the hydrogen peroxide solution into the inner tank 10, the sulfuric acid and the hydrogen peroxide solution are mixed with each other.

Mixture of the sulfuric acid and the hydrogen peroxide solution is classified into the following two patterns.

The first pattern is the following chemical reaction.

$$H_2SO_4 + H_2O_2 \rightarrow H_2SO_4 + H_2O + O^* \qquad \text{Formula (1)}$$

The reaction represented by Formula (1) generates an active oxygen ($O^*$). This active oxygen is a strong oxidizer.

The second pattern is the following chemical reaction.

$$H_2SO_4 + H_2O_2 \rightarrow H_2SO_5 + H_2O \qquad \text{Formula (2)}$$

The reaction represented by Formula (2) generates a peroxomonosulfuric acid ($H_2SO_5$). Similar to the active oxygen, the peroxomonosulfuric acid is also a strong oxidizer. However, the peroxomonosulfuric acid is more effective than the active oxygen in decomposing an organic matter such as a resist adhering to a wafer. That is to say, by mixing a sulfuric acid and a hydrogen peroxide solution to generate a peroxomonosulfuric acid, it is possible to fully remove a resist adhering to a wafer therefrom.

Figure 7:
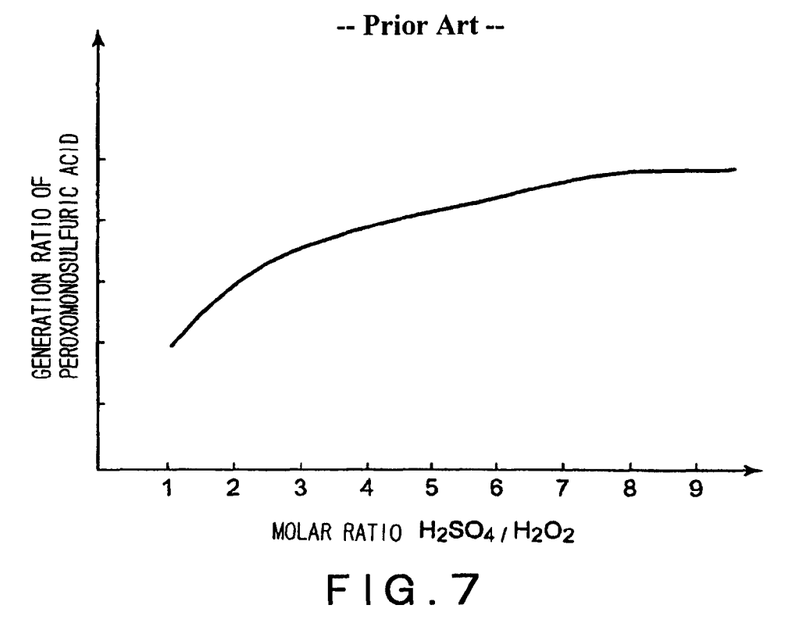
FIG. 7 is a graph in which a horizontal axis shows a ratio (molar ratio) of a sulfuric acid relative to a hydrogen peroxide solution, and a vertical axis shows a generation ratio of a peroxomonosulfuric acid.

FIG. 7 is a graph in which a horizontal axis shows a ratio (molar ratio) of a sulfuric acid relative to a hydrogen peroxide solution, and a vertical axis shows a generation ratio of peroxomonosulfuric acid. As shown in FIG. 7, when the ratio (molar ratio) of a sulfuric acid relative to a hydrogen peroxide solution is raised, the generation ratio of peroxomonosulfuric acid is correspondingly increased. Thus, a resist adhering to a wafer can be more sufficiently removed. For this reason, a ratio between supply rates of a sulfuric acid and a hydrogen peroxide solution to be supplied into the inner tank 10 is set at, for example, 5:1.

After the supply of the sulfuric add and the hydrogen peroxide solution into the inner tank 10 is finished, the return pump 16 is activated to return the liquid in the outer tank 12 into the inner tank 10 through the return pipe 14. Again, the liquid overflows from the inner tank 10 to the outer tank 12. In this manner, the liquid is circulated through the combination unit of the inner tank 10 and the outer tank 12. At the same time, the heater 20 is activated to heat the liquid passing through the return pipe 14. Thus, a temperature of the liquid contained in the inner tank 10 is heated to a temperature suitable for cleaning a wafer (e.g., 100° C. to 150° C.).

After the return pipe 16 and the heater 20 are kept in ON state until a temperature of the liquid in the inner tank 10 reaches a certain temperature, the return pipe 16 and the heater 20 are again switched off. Thereafter, a plurality of wafers are all together immersed into the inner tank 10. Thus, a resist adhering to each wafer is decomposed by the mixture liquid of the sulfuric acid and the hydrogen peroxide solution, more specifically, a peroxomonosulfuric acid generated by mixing the sulfuric acid and the hydrogen peroxide solution, to thereby remove the resist from the wafer. In this manner, a series of steps for cleaning the wafer is completed.

DISCLOSURE OF THE INVENTION

However, there is case in which a sufficient supply amount of a sulfuric acid into the inner tank 10 cannot be practically ensured. That is to say, the chemical-liquid mixing apparatus as shown in FIG. 6 is generally installed in a wafer manufacturing factory where a sulfuric acid is directly supplied into the inner tank 10 of the chemical-liquid mixing apparatus from a sulfuric-acid storage tank for collectively storing a sulfuric add to be used in the factory or a sulfuric acid generator for collectively generating a sulfuric acid to be used in the factory. Since this structure elongates a supply line for a sulfuric acid, there is a possibility that a supply of a sulfuric acid cannot be smoothly carried out because of a high specific gravity and density thereof. Specifically, when the chemical-liquid mixing apparatus is installed in a wafer manufacturing factory, and a sulfuric acid is supplied from a sulfuric-acid storage tank in the factory into the inner tank 10 of the chemical-liquid mixing apparatus, it may occur that a supply rate of a hydrogen peroxide solution is 5 liters/min, while a supply rate of a sulfuric acid is only 1 to 2 liters/min.

Under this condition, since a ratio of the sulfuric acid relative to the hydrogen peroxide solution is quite low, a generation ratio of peroxomonosulfuric acid, which is to be generated when a sulfuric acid and a hydrogen peroxide solution are mixed with each other, becomes undesirably low, as shown in FIG. 7. In this case, the chemical reaction represented by Formula (1) takes place more actively than the chemical reaction represented by Formula (2), and a sufficient amount of peroxomonosulfuric acid cannot be generated. Thus, a resist cannot be fully removed from a wafer.

Figure 8:
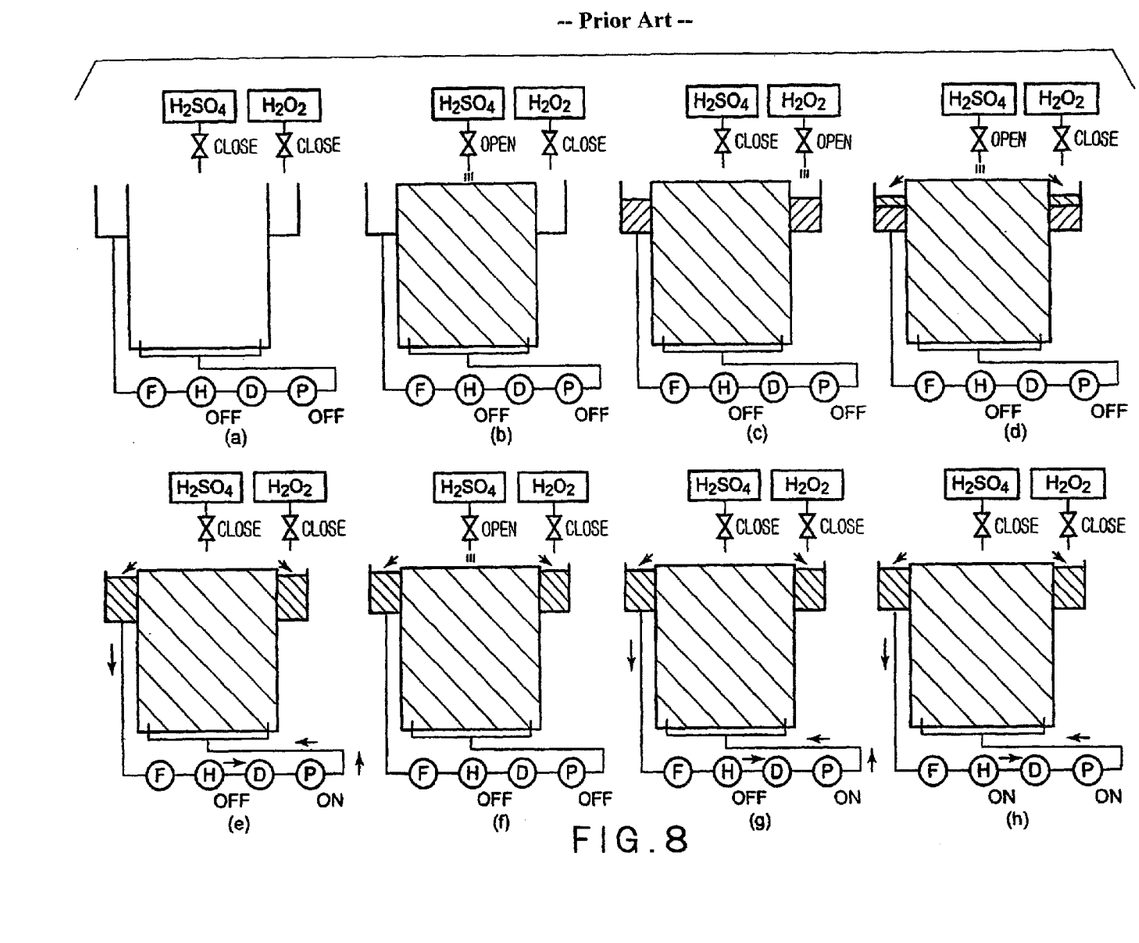
FIG. 8 shows views (a) to (h) illustrating sequential steps of a conventional chemical-liquid mixing method.

Another example of a chemical-liquid mixing method is shown in FIG. 8. FIG. 8(a) to FIG. 8(h) sequentially show steps of another general chemical-liquid mixing method.

The chemical-liquid mixing apparatus used in the chemical liquid mixing steps shown in FIG. 8 is identical to the chemical-liquid mixing apparatus shown in FIG. 6, excluding that a hydrogen peroxide solution is not supplied into an inner tank but into an outer tank.

As shown in FIG. 8(a), the inner tank and the outer tank are empty in their initial states. A return pump and a heater are OFF.

At first, as shown in FIG. 8(b), a sulfuric-add supply valve is opened, and a sulfuric acid is supplied into the inner tank so as to fill the inner tank. Then, as shown in FIG. 8(c), the sulfuric-acid supply valve is closed, and a hydrogen-peroxide-solution supply valve is opened to supply a hydrogen peroxide solution into the outer tank. Thereafter, as shown in FIG. 8(d), the hydrogen-peroxide-solution supply valve is closed, and the sulfuric-acid supply valve is again opened to further supply a sulfuric acid into the inner tank. Since the inner tank has been already filled up with the sulfuric acid, the sulfuric acid overflows to the outer tank so that the sulfuric acid and the hydrogen peroxide solution are mixed with each other in the outer tank.

Subsequently, as shown in FIG. 8(e), the sulfuric-acid supply valve is again closed, and the return pump is switched on. Thus, the liquid in the outer tank is returned to the inner tank, and the liquid in the inner tank overflows to the outer tank. Namely, the liquid is circulated through the combination unit of the inner tank and the outer tank. After a passage of a certain period of time, as shown in FIG. 8(f), the return pump is temporarily made OFF, and the sulfuric-acid supply valve is opened to supply a certain amount of a sulfuric acid into the inner tank. Then, as shown in FIG. 8(g), the sulfuric-acid supply valve is again closed, and simultaneously therewith the return pump is switched on so as to circulate the liquid again. Finally, after a previously set time period has passed, as shown in FIG. 8(h), the heater is switched on to heat the liquid passing through the return pipe. Thus, a temperature of the liquid in the inner tank is raised to a temperature suitable for cleaning wafers (e.g., 100° C. to 150° C.).

However, even in the chemical-liquid mixing method shown in FIG. 8, a ratio of the sulfuric acid relative to the hydrogen peroxide solution is low in the outer tank, a peroxomonosulfuric acid cannot be sufficiently generated. In other words, there still occurs the problem in that a resist cannot be fully removed from a wafer.

The present invention has been made in view of the above. The object of the present invention is to provide a chemical-liquid mixing method and a chemical-liquid mixing apparatus capable of generating an enough peroxomonosulfuric acid which is effective in removing a resist from a substrate, when a sulfuric add and a hydrogen peroxide solution are mixed with each other.

The chemical-liquid mixing method according to the present invention is a chemical-liquid mixing method for mixing a sulfuric acid and a hydrogen peroxide solution, the method comprising the steps of: preparing respectively an inner tank; an outer tank disposed around the inner tank, into which outer tank a liquid overflowing from the inner tank flows; a return pipe configured to return the liquid in the outer tank to the inner tank; and a return pump provided on the return pipe for sending the liquid in the outer tank to the inner tank; supplying a sulfuric acid into the inner tank for filling the inner tank with the sulfuric acid, and allowing the sulfuric acid overflowing from the inner tank to flow into the outer tank; supplying a hydrogen peroxide solution into the inner tank or the outer tank, after the sulfuric-acid supplying step, and allowing the hydrogen peroxide solution to flow into the outer tank to store in the outer tank the two kinds of liquids of the hydrogen peroxide solution and the sulfuric acid; and activating the return pump simultaneously with the start of the hydrogen-peroxide-solution supplying step to simultaneously send to the inner tank the two kinds of liquids of the hydrogen peroxide solution and the sulfuric acid in the outer tank, while mixing the hydrogen peroxide solution and the sulfuric acid with each other.

In addition, the chemical-liquid mixing apparatus according to the present invention is a chemical-liquid mixing apparatus for mixing a sulfuric add and a hydrogen peroxide solution, the apparatus comprising: an inner tank; an outer tank disposed around the inner tank, into which outer tank a liquid overflowing from the inner tank flows; a return pipe configured to return the liquid in the outer tank to the inner tank; and a return pump provided on the return pipe for sending the liquid in the outer tank to the inner tank; a sulfuric-acid supply unit configured to supply a sulfuric acid into the inner tank; a hydrogen-peroxide-solution supply unit configured to supply a hydrogen peroxide solution to the inner tank or the outer tank; and a controller configured to control the sulfuric-acid supply unit, the hydrogen-peroxide-solution supply unit, and the return pump, the controller controlling at first the sulfuric-acid supply unit to fill the inner tank with a sulfuric acid, allowing the sulfuric acid overflowing from the inner tank to flow into the outer tank, then the controller controlling the hydrogen-peroxide-solution supply unit to supply a hydrogen peroxide solution into the inner tank or the outer tank, allowing the hydrogen peroxide solution to flow into the outer tank whereby the two kinds of liquids of the hydrogen peroxide solution and the sulfuric acid are stored in the outer tank, and the controller activating the return pump simultaneously with the start of the activation of the hydrogen-peroxide-solution supply unit.

According to the chemical-liquid mixing method and the chemical-liquid mixing apparatus, since the hydrogen peroxide solution is added to the sulfuric acid which has been already stored in the outer tank, a ratio of the sulfuric acid relative to the hydrogen peroxide solution is increased in the outer tank. Therefore, a generation ratio of a peroxomonosulfuric acid can be elevated. Further, since the return pump is activated simultaneously when the hydrogen peroxide solution flows into the outer tank, there is performed a so-called stirring of the sulfuric acid and the hydrogen peroxide solution in the return pipe. During the stirring operation, since an amount of the hydrogen peroxide solution is relatively small, generation of a peroxomonosulfuric add is further promoted in the return pipe. Therefore, a ratio of the amount of peroxomonosulfuric acid contained in a finally produced mixture liquid of the sulfuric acid and the hydrogen peroxide solution is increased. As a result, a mixture liquid that is effective in removing a resist from a substrate can be provided.

In the chemical-liquid mixing method according to the present invention, it is preferable that a heater is provided on the return pipe, and that a heater activating step for activating the heater is performed after a preset period of time has passed from the start of the return-pump activating step.

In the chemical-liquid mixing apparatus according to the present invention, it is preferable that a heater is provided on the return pipe, and that the controller controls the heater such that the heater is activated after a preset period of time has passed from the activation of the return pump.

In generating a peroxomonosulfuric acid by mixing a sulfuric acid and a hydrogen peroxide solution with each other, if temperatures of the liquids which have not been mixed yet are excessively high, a peroxomonosulfuric acid cannot be sufficiently generated. However, since there is an enough period of time in which the return pump is operated while the heater is not operated, in other words, since there is a period of time in which only a circulation of the liquids is performed, an enough amount of peroxomonosulfuric acid can be generated.

Preferably, the chemical-liquid mixing method according to the present invention further comprises a hydrogen-peroxide-solution replenishing step for replenishing a hydrogen peroxide solution by a hydrogen-peroxide-solution replenishing pipe that is communicated with the return pipe.

In the chemical-liquid mixing apparatus according to the present invention, it is preferable that a hydrogen-peroxide-solution replenishing pipe for replenishing a hydrogen peroxide solution is arranged in communication with the return pipe.

With this structure, when a hydrogen peroxide solution is replenished, the hydrogen peroxide solution is directly sent to the return pipe. Thus, a so-called stirring of the replenished hydrogen peroxide solution and the sulfuric acid is performed in the return pipe. During the stirring operation, since an amount of the hydrogen peroxide solution is relatively small, an enough peroxomonosulfuric acid can be generated in the return pipe. Therefore, a ratio of the amount of a peroxomonosulfuric acid generated by the replenishment of the hydrogen peroxide solution is increased. As a result, a resist removing efficiency of the mixture liquid can be maintained.

BEST MODE FOR CARRYING OUT THE INVENTION

Figure 1:
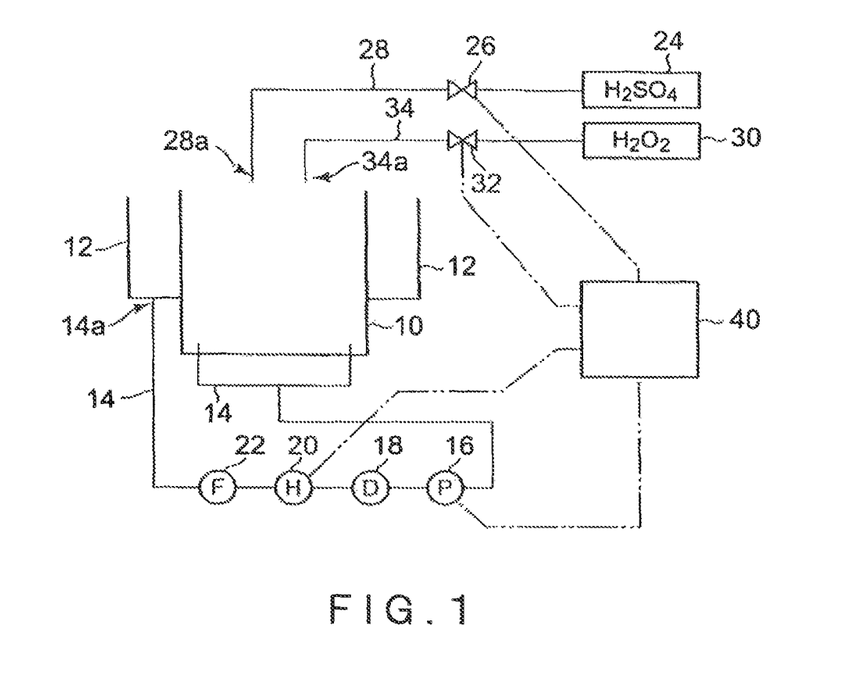
FIG. 1 is a schematic structural view showing a structure of a chemical-liquid mixing apparatus in one embodiment of the present invention.
Figure 2:
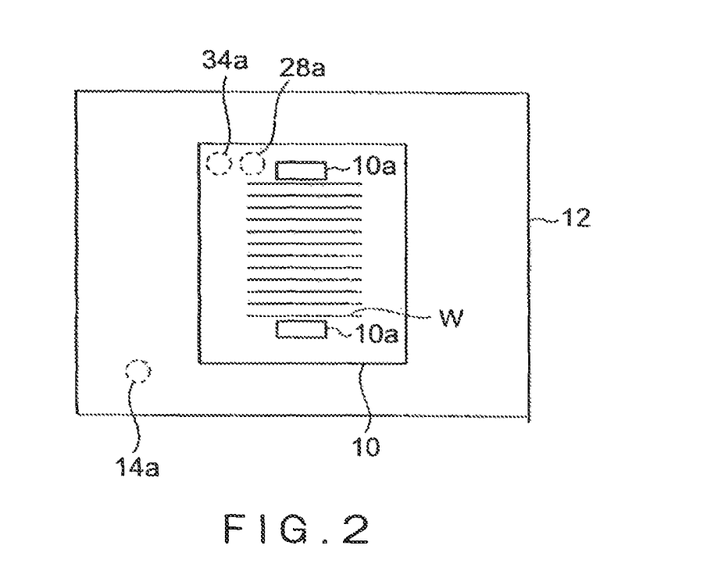
FIG. 2 is a top view showing an inner tank and an outer tank in the chemical-liquid mixing apparatus shown in FIG. 1.
Figure 3:
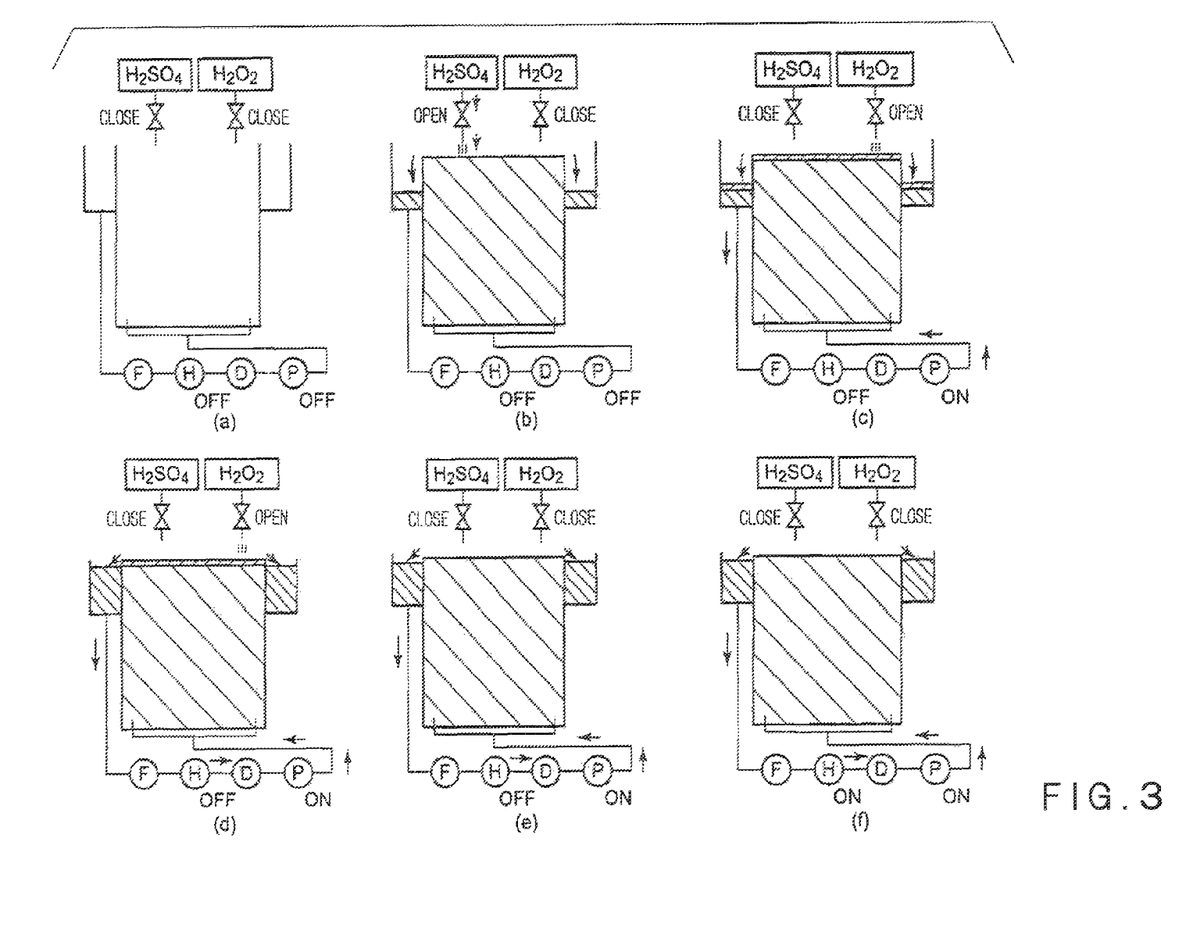
FIG. 3 shows views (a) to (f) illustrating sequential steps of a chemical-liquid mixing method carried out by the chemical-liquid mixing apparatus shown in FIG. 1.

An embodiment of the present invention will be described below with reference to the accompanying drawings. FIGS. 1 to 3 are views showing a chemical-liquid mixing apparatus in one embodiment according to the present invention. FIG. 1 is a schematic structural view showing a structure of the chemical-liquid mixing apparatus in this embodiment. FIG. 2 is a top view showing an inner tank and an outer tank in the chemical-liquid mixing apparatus shown in FIG. 1. FIG. 3 shows views (a) to (f) illustrating sequential steps of a chemical-liquid mixing method carried out by the chemical-liquid mixing apparatus shown in FIG. 1.

In FIGS. 1 to 3, the same members as those in the conventional chemical-liquid mixing apparatus shown in FIG. 6 are depicted by the same reference numbers as those in FIG. 6.

As shown in FIG. 1, the chemical-liquid mixing apparatus in this embodiment includes an inner tank 10 in which a wafer W is accommodated, and an outer tank 12 disposed around the inner tank 10, into which a liquid overflowing from the inner tank 10 flows. There is disposed a return pipe 14 for returning the liquid in the outer tank 12 into the inner tank 10. In the return pipe 14, there are serially arranged a return pump 16 for sending a liquid in the outer tank 12 to the inner tank 10, a dumper 18 for reducing vibrations or the like of the return pipe 14, a heater 20 for heating a liquid passing through the return pipe 14, and a filter 22 for filtering a liquid passing through the return pipe 14. The chemical-liquid mixing apparatus also includes a sulfuric-acid storage tank 24 for storing a sulfuric acid ($H_2SO_4$), and a hydrogen-peroxide-solution storage tank 30 for storing a hydrogen peroxide ($H_2O_2$) solution. The sulfuric add and the hydrogen peroxide solution stored in the respective storage tanks 24 and 30 are supplied into the inner tank 10 by a sulfuric-acid supply pipe 28 and a hydrogen-peroxide-solution supply pipe 34, respectively. Supply operations of the respective chemical liquids are adjusted by a sulfuric-acid supply valve 26 and a hydrogen-peroxide-solution supply valve 32, respectively. Further, the chemical-liquid mixing apparatus includes a controller 40 that controls the return pump 16, the heater 20, the sulfuric-acid supply valve 26, and the hydrogen-peroxide-solution supply valve 32.

Herebelow, the respective components of the chemical-liquid mixing apparatus are described in detail with reference to FIGS. 1 and 2.

As shown in FIG. 2, the inner tank 10 is of substantially a rectangular solid shape. The outer tank 12 is also of substantially a rectangular solid shape which is larger than the inner tank 10. The outer tank 12 is disposed to surround the circumference of the inner tank 10. As described above, a liquid overflowing from the inner tank 10 is sent to the outer tank 12. The return pipe 14 is diverged into two parts whose ends are connected to a bottom of the inner tank 10. Thus, a liquid sent from the return pipe 14 can enter the inner tank 10 through the bottom thereof. As shown in FIG. 2, the inner tank 10 is provided with a pair of wafer holders 10a for holding a plurality of wafers W that are arranged in order.

As shown in FIGS. 1 and 2, an intake 14a of the return pipe 14 is connected to a bottom of the outer tank 12. A sulfuric-acid supply port 28a of the sulfuric-acid supply pipe 28 is positioned above the inner tank 10 near a side periphery thereof. A hydrogen-peroxide-solution supply port 34a of the hydrogen-peroxide-solution supply pipe 34 is positioned above the inner tank 10 near a corner thereof.

As shown in FIG. 1, the sulfuric-acid storage tank 24, the sulfuric-acid supply valve 26, and the sulfuric-acid supply pipe 28 constitute a sulfuric-acid supply unit for supplying a sulfuric acid into the inner tank 10. On the other hand, the hydrogen-peroxide-solution storage tank 30, the hydrogen-peroxide-solution supply valve 32, and the hydrogen-peroxide-solution supply pipe 34 constitute a hydrogen-peroxide-solution supply unit for supplying a hydrogen peroxide solution into the inner tank 10.

As shown in FIG. 1, the controller 40 is connected to and communicated with the return pump 16, the heater 20, the sulfuric-acid supply valve 26, and the hydrogen-peroxide-solution supply valve 32. The controller 40 controls each of these members by sending control signals thereto. Specifically, the controller 40 opens at first the sulfuric-acid supply valve 26 to fill the inner tank 10 with a sulfuric acid, so that the overflowing sulfuric acid from the inner tank 10 flows into the outer tank 12. Then, the controller 40 opens the hydrogen-peroxide-solution supply valve 32 to supply a hydrogen peroxide solution into the inner tank 10, so that the hydrogen peroxide solution flows into the outer tank 12, whereby the two kinds of liquids, i.e., the hydrogen peroxide solution and the sulfuric acid, are stored in the outer tank 12. Then, the controller 40 opens the hydrogen-peroxide-solution supply valve 32, and simultaneously activates the return pump 16. In addition, the controller 40 activates the heater 20 after an elapse of a preset period (e.g., 15 minutes) from the activation of the return pump 16. Details of the control operations by the controller 40 are described hereafter.

Next, operations of the chemical-liquid mixing apparatus in this embodiment are described. Specifically, with reference to FIG. 3, there is described a method of producing a mixture liquid by using the above chemical-liquid mixing apparatus shown in FIG. 1 and so on.

As shown in FIG. 3(a), the inner tank 10 and the outer tank 12 are empty in their initial states. At this time, the return pump 16 and the heater are in OFF state.

At first, as shown in FIG. 3(b), while the return pump 16 and the heater 20 are kept OFF, the sulfuric-acid supply valve 26 is opened by a control command from the controller 40 so as to supply a sulfuric acid into the inner tank 10. The supply of the sulfuric acid is continued until the inner tank 10 is filled up with the sulfuric acid and the sulfuric acid overflows into the outer tank 12.

Then, as shown in FIG. 3(c), in accordance with a control command from the controller 40, the sulfuric-acid supply valve 26 is closed, and the hydrogen-peroxide-solution supply valve 32 is opened so as to supply a hydrogen peroxide solution into the inner tank 10. Since the hydrogen-peroxide-solution supply port 34a of the hydrogen-peroxide-solution supply pipe 34 is positioned near the corner of the inner tank 10, a hydrogen peroxide solution falling into the inner tank 10 by gravity from the hydrogen-peroxide-solution supply port 34a immediately overflows into the outer tank 12. In this manner, the hydrogen peroxide solution flows into the outer tank 12, and thus the two kinds of liquids of the hydrogen peroxide solution and the sulfuric acid are stored in the outer tank 12.

As shown in FIG. 3(d), the hydrogen-peroxide-solution supply valve 32 is closed by a control command from the controller 40. Simultaneously, the controller 40 activates the return pump 16. Thus, while the hydrogen peroxide solution is being continuously supplied into the outer tank 12, the two kinds of liquids of the hydrogen peroxide solution and the sulfuric acid are withdrawn from the outer tank 12 by the return pump 16 through the return pipe 14. In this manner, the liquid is circulated through the combination unit of the inner tank 10 and the outer tank 12. At this time, there is performed a so-called stirring of the two kinds of liquids of the hydrogen peroxide solution and the sulfuric acid, in the return pipe 14 by the return pump 16, whereby the two kinds of liquids are mixed with each other.

Subsequently, as shown in FIG. 3(e), when the mixture liquid reaches a certain level in the outer tank 12, the hydrogen-peroxide-solution supply valve 32 is closed by a control command from the controller 40 to stop the supply of the hydrogen peroxide solution. However, the operation of the return pump 16 is continued so that the liquid is continuously circulated through the combination unit of the inner tank 10 and the outer tank 12. Due to the circulation of the liquid, the mixture operation of the hydrogen peroxide solution and the sulfuric acid is consecutively carried out.

Finally, as shown in FIG. 3(f), after an elapse of a preset period (e.g., 15 minutes) from the activation of the return pump 16, the controller 40 activates the heater 20. Thus, the liquid passing through the return pipe 14 is heated, and a temperature of the liquid in the inner tank 10 is raised at a temperature suitable for cleaning wafers W, specifically, 100° C. to 150° C., for example.

At last, when the temperature of the liquid in the inner tank 10 reaches a certain temperature, the controller 40 stops the return pump 16 and the heater 20. Following thereto, a plurality of wafers W are all together immersed into the inner tank 10, to decompose a resist adhering to each wafer by the mixture liquid of the sulfuric acid and the hydrogen peroxide solution, more specifically a peroxomonosulfuric acid generated by mixing the sulfuric acid and the hydrogen peroxide solution, to thereby remove the resist from the wafer. In this manner, a series of steps for cleaning the wafers is completed.

According to the chemical-liquid mixing method and the chemical-liquid mixing apparatus in this embodiment, the inner tank 10 is firstly filled up with a sulfuric acid, and the sulfuric acid overflowing from the inner tank 10 flows into the outer tank 12. Then, by supplying a hydrogen peroxide solution into the inner tank 10, the hydrogen peroxide solution flows into the outer tank 12, whereby the two kinds of liquids of the hydrogen peroxide solution and the sulfuric acid are stored in the outer tank 12. The return pump 16 is activated simultaneously when the hydrogen peroxide solution flows into the outer tank 12. Since the hydrogen peroxide solution is added to the sulfuric acid which has been already stored in the outer tank 12, a ratio of the sulfuric acid relative to the hydrogen peroxide solution is increased in the outer tank 12. Therefore, a generation ratio of a peroxomonosulfuric acid can be elevated. Further, since the return pump 16 is activated simultaneously when the hydrogen peroxide solution flows into the outer tank 12, there is performed a so-called stirring of the sulfuric acid and the hydrogen peroxide solution in the return pipe 14. During the stirring operation, since an amount of the hydrogen peroxide solution is relatively small, generation of a peroxomonosulfuric acid is further promoted in the return pipe 14. Therefore, a ratio of the amount of peroxomonosulfuric acid contained in a finally produced mixture liquid of the sulfuric acid and the hydrogen peroxide solution is increased. As a result, a mixture liquid that is effective in removing a resist from a substrate can be provided.

In addition, the return pipe 14 is provided with the heater 20 which is activated after a preset period has elapsed from the activation of the return pump 16. In generating a peroxomonosulfuric acid by mixing a sulfuric acid and a hydrogen peroxide solution with each other, if temperatures of the liquids which have not been mixed yet are excessively high, a peroxomonosulfuric acid cannot be sufficiently generated. However, since there is an enough period of time in which the return pump 16 is operated while the heater 20 is not operated, in other words, since there is a period of time in which only a circulation of the liquids is performed, an enough amount of peroxomonosulfuric acid can be generated.

The chemical-liquid mixing method and the chemical-liquid mixing apparatus are not limited to the above embodiment, and various changes and modifications are possible. For example, in place of using the sulfuric-acid supply valve 26 and the hydrogen-peroxide-solution supply valve 32 shown in FIG. 1 as the sulfuric-acid supply unit and the hydrogen-peroxide-solution supply unit, supply pumps may be respectively provided on the sulfuric-acid supply pipe 28 and the hydrogen-peroxide-solution supply pipe 34 so as to supply a sulfuric acid and a hydrogen peroxide solution by these supply pumps from the sulfuric-acid storage tank 24 and the hydrogen-peroxide-solution storage tank 30, respectively. In this case, the controller 40 controls these supply pumps, in place of controlling the sulfuric-acid supply valve 26 and the hydrogen-peroxide-solution supply valve 32.

Figure 4:
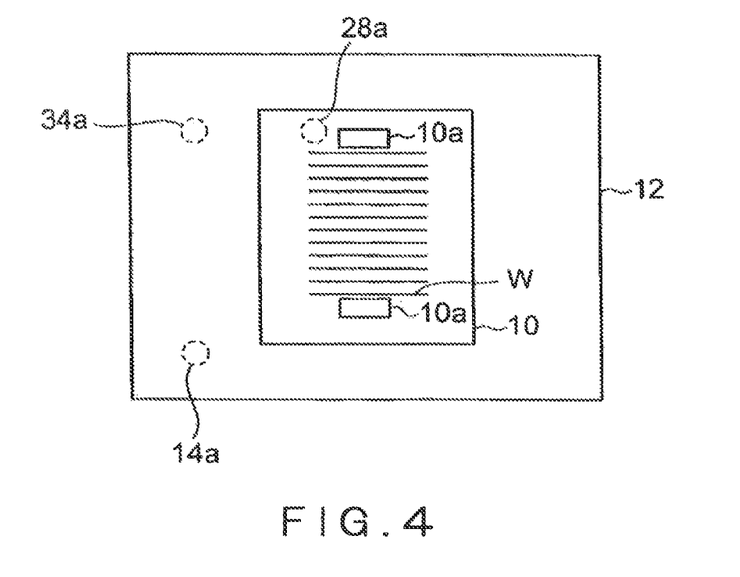
FIG. 4 is a top view showing an inner tank and an outer tank in another embodiment of the chemical-liquid mixing apparatus shown in FIG. 1.

Further, in place of positioning the hydrogen-peroxide-solution supply port 34a of the hydrogen-peroxide-solution supply pipe 34 above the inner tank 10, the hydrogen-peroxide-solution supply port 34a may be positioned above the outer tank 12, which is shown in FIG. 4. In this case, a hydrogen peroxide solution can be directly supplied from the hydrogen-peroxide-solution storage tank 30 into the outer tank 12.

An amount of a peroxomonosulfuric acid contained in the mixture liquid is decreased by repeating the wafer cleaning process. In order to cope with this, the present method may further include a hydrogen-peroxide-solution replenishing step for replenishing a hydrogen peroxide solution. A hydrogen peroxide solution is replenished through a hydrogen-peroxide-solution replenishing pipe 36 shown in FIG. 5. One end of the hydrogen-peroxide-solution replenishing pipe 36 is communicated with the hydrogen-peroxide-solution storage tank 30, and the other end thereof passes through the outer tank 12 to extend into an inside of the return pipe 14. The hydrogen-peroxide-solution replenishing pipe 36 is provided with a hydrogen-peroxide-solution replenishing valve 38 for switching on and off the replenishment of a hydrogen peroxide solution.

Figure 5:
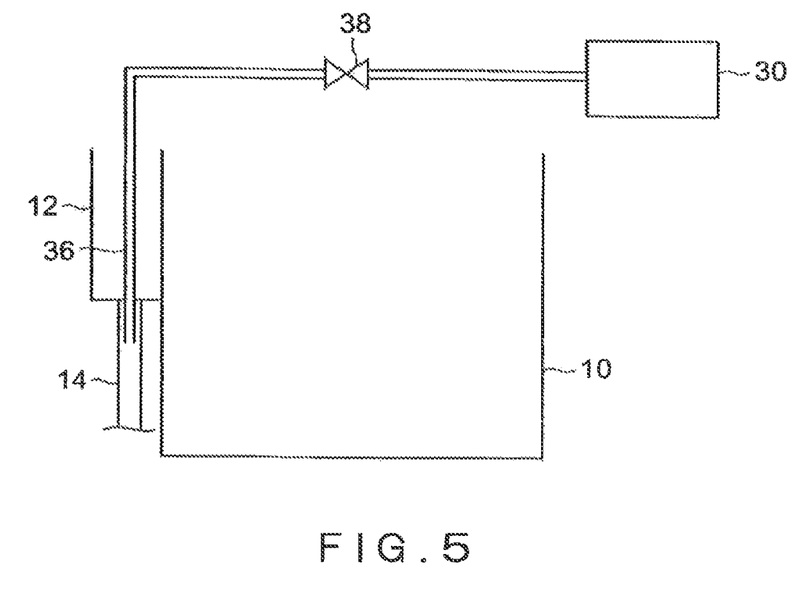
FIG. 5 is a structural view showing still another embodiment of the chemical-liquid mixing apparatus shown in FIG. 1.

Since the other end of the hydrogen-peroxide-solution replenishing pipe 36 reaches the inside of the return pipe 14, when a hydrogen peroxide solution is replenished, the hydrogen peroxide solution transferred from the hydrogen-peroxide-solution storage tank 30 is directly sent to the return pipe 14. Thus, a so-called stirring of the replenished hydrogen peroxide solution and the sulfuric acid is performed in the return pipe 14. During the stirring operation, since an amount of the hydrogen peroxide solution is relatively small, an enough peroxomonosulfuric acid can be generated in the return pipe 14. Therefore, a ratio of the amount of a peroxomonosulfuric acid generated by the replenishment of the hydrogen peroxide solution is increased. As a result, a resist removing efficiency of the mixture liquid can be maintained.

EXAMPLE

Next, a Present Example of the chemical-liquid mixing method and the chemical-liquid mixing apparatus as shown in FIGS. 1 to 3 is described below. A Comparative Example of a chemical-liquid mixing method as shown in FIG. 8 is described for comparison.

Present Example

A chemical-liquid mixing apparatus as shown in FIG. 1 was prepared. The chemical-liquid mixing apparatus includes an inner tank 10 in which a wafer W is accommodated, and an outer tank 12 disposed around a circumference of the inner tank 10, into which a liquid overflowing from the inner tank 10 flows. There is disposed a return pipe 14 for returning the liquid in the outer tank 12 into the inner tank 10. In the return pipe 14, there are serially arranged a return pump 16 for returning a liquid in the outer tank 12 to the inner tank 10, a dumper 18 for reducing vibrations or the like of the return pipe 14, a heater 20 for heating a liquid passing through the return pipe 14, and a filter 22 for filtering a liquid passing through the return pipe 14.

The chemical-liquid mixing apparatus in the Present Example also includes a sulfuric-acid storage tank 24 for storing a sulfuric acid ($H_2SO_4$), and a hydrogen-peroxide-solution storage tank 30 for storing a hydrogen peroxide ($H_2O_2$) solution. The sulfuric acid and the hydrogen peroxide solution stored in the respective storage tanks 24 and 30 are supplied into the inner tank 10 by a sulfuric-acid supply pipe 28 and a hydrogen-peroxide-solution supply pipe 34, respectively. A concentration of the sulfuric acid was 98 wt %, and a concentration of the hydrogen peroxide solution was 30 wt %. Supply operations of the respective chemical liquids are adjusted by a sulfuric-acid supply valve 26 and a hydrogen-peroxide-solution supply valve 32, respectively. A supply rate of the sulfuric acid supplied by the sulfuric-acid supply unit was 4 liters/min, and a supply rate of the hydrogen peroxide solution by the hydrogen-peroxide-solution supply unit was 1 liter/min.

The chemical-liquid mixing apparatus in the Present Example further includes a controller 40 for controlling the return pump 16, the heater 20, the sulfuric-acid supply valve 26, and the hydrogen-peroxide-solution supply valve 32. FIG. 3 shows control operations of the controller 40, and details thereof are described below.

As shown in FIG. 3(a), the inner tank and the outer tank were empty in their initial states. At first, as shown in FIG. 3(b), while the return pump and the heater were kept OFF, the sulfuric-acid supply valve was opened to supply a sulfuric add into the inner tank. The supply of the sulfuric add was continued until the inner tank was filled up with sulfuric add and the sulfuric add overflowed into the outer tank.

Then, as shown in FIG. 3(c), the sulfuric-acid supply valve was closed, and the hydrogen-peroxide-solution supply valve was opened to supply a hydrogen peroxide solution into the inner tank. At this time, the hydrogen peroxide solution falling from a hydrogen-peroxide-solution supply port by gravity immediately overflowed into the outer tank. In this manner, the hydrogen peroxide solution flowed into the outer tank, and thus the two kinds of liquids of the hydrogen peroxide solution and the sulfuric acid were stored in the outer tank.

As shown in FIG. 3(d), the hydrogen-peroxide-solution supply valve was opened, and the return pump was activated at the same time. Thus, while the hydrogen peroxide solution was being continuously supplied into the outer tank, the two kinds of liquids of the hydrogen peroxide solution and the sulfuric acid were withdrawn from the outer tank by the return pump through the return pipe. In this manner, the liquids are circulated through the combination of the inner tank and the outer tank, whereby the hydrogen peroxide solution and the sulfuric acid were mixed with each other.

Subsequently, as shown in FIG. 3(e), when an amount of the liquid stored in the outer tank reached about 90 percent of a total storage amount of the outer tank, the hydrogen-peroxide-solution supply valve was closed to stop the supply of the hydrogen peroxide solution. However, the return pump continued its operation so that the liquids were continuously circulated through the combination unit of the inner tank and the outer tank. Due to the circulation of the liquids, the hydrogen peroxide solution and the sulfuric acid were consecutively mixed with each other.

Finally, as shown in FIG. 3(f), after a passage of 10 minutes from the activation of the return pump, the heater was activated. Thus, the liquid passing through the return pipe was heated, and a temperature of the liquid in the inner tank was raised at 100° C. in the last place.

Figure 9:
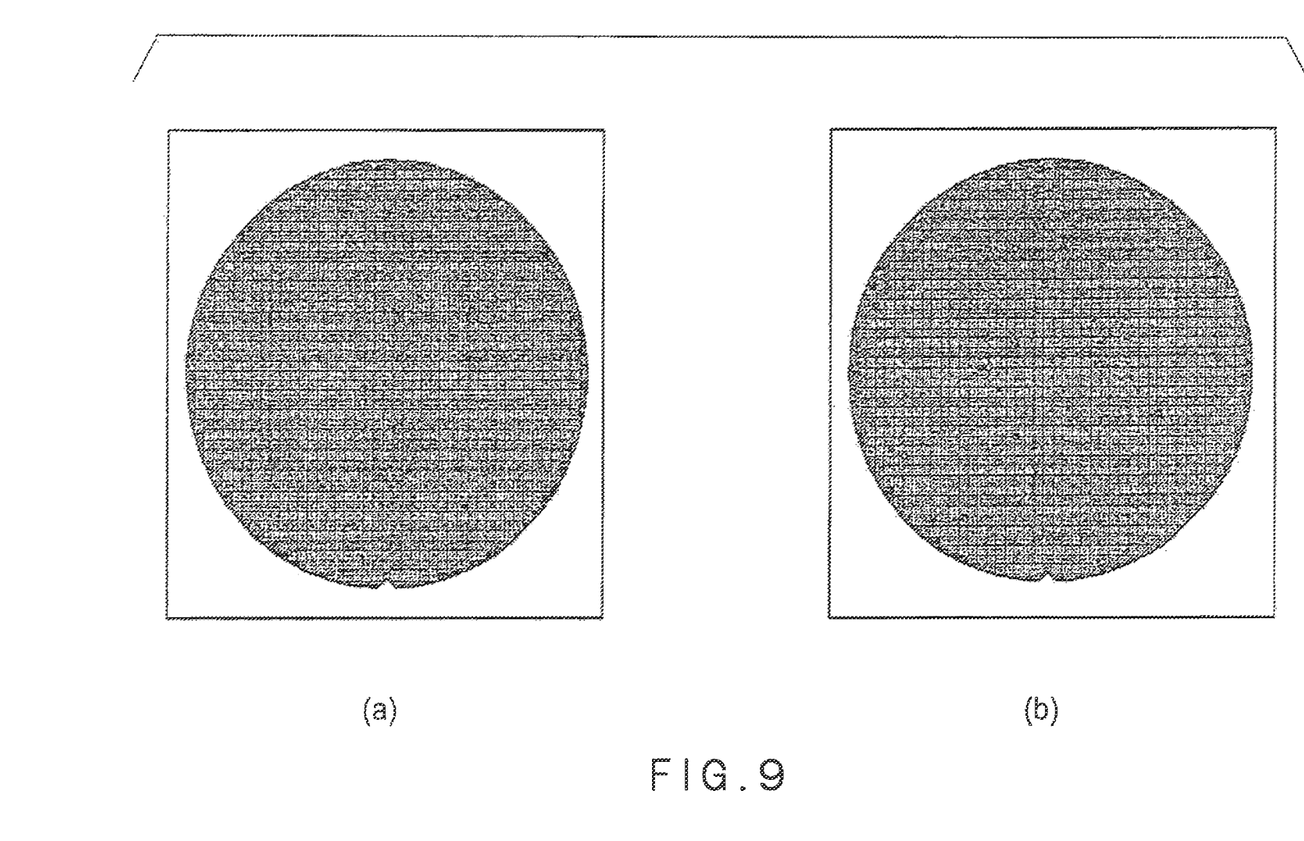
FIG. 9 shows a view (a) illustrating a condition of residue of a resist on a cleaned wafer of Present Example, and a view (b) illustrating a condition of residues of a resist on a cleaned wafer of Comparative Example.

At last, the return pump and the heater were stopped. Following thereto, a wafer was immersed into the inner tank so as to remove a resist adhering to the wafer therefrom by the mixture liquid of the sulfuric acid and the hydrogen peroxide solution. FIG. 9(a) shows a condition of residues of a resist on the wafer which had been immersed in the mixture liquid in the inner tank and was taken up therefrom.

Comparative Example

Also in the Comparative Example, a chemical-liquid mixing apparatus as shown in FIG. 1 was prepared. Volumes of an inner tank 10 and an outer tank 10 of the chemical-liquid mixing apparatus were identical to those in the chemical-liquid mixing apparatus of the Present Example. Similarly, structures of a return pipe and a return pump 16, and structures of sulfuric-acid supply unit and hydrogen-peroxide-solution supply unit were identical to those in the chemical-liquid mixing apparatus of the Present Example. However, control operations conducted by a controller 40 was different from the method of the Present Example as shown in FIG. 3. The control operations in the Comparative Example are shown in FIG. 8, which are described in detail below.

As shown in FIG. 8(a), the inner tank and the outer tank were empty in their initial states. Under this condition, as shown in FIG. 8(b), a sulfuric-acid supply valve was opened to supply a sulfuric acid into the inner tank until the inner tank was filled up with the sulfuric acid. Then, as shown in FIG. 8(c), the sulfuric-acid supply valve was closed, and a hydrogen-peroxide-solution supply valve was opened to supply a hydrogen peroxide solution into the outer tank. After that, as shown in FIG. 8(d), the hydrogen-peroxide-solution supply valve was closed, and the sulfuric-acid supply valve was again opened to supply a sulfuric acid into the inner tank. Since the inner tank had been already filled up with the sulfuric acid, the sulfuric add overflowed into the outer tank where the sulfuric acid and the hydrogen peroxide solution were mixed with each other.

Subsequently, as shown in FIG. 8(e), the sulfuric-acid supply valve was again closed, and the return pump was switched on. Thus, the liquid in the outer tank was returned to the inner tank and the liquid in the inner tank overflowed into the outer tank, whereby the liquid was circulated in the combination unit of the inner tank and the outer tank. After about 10 minutes had passed, as shown in FIG. 8(f), the return pump was temporarily made OFF, and the sulfuric-acid supply valve was opened to supply a sulfuric acid into the inner tank. Thereafter, as shown in FIG. 8(g), the sulfuric-acid supply valve was again closed, and the return pump was switched on so as to again circulate the liquid. Finally, after a passage of about 10 minutes, as shown in FIG. 8(h), the heater was switched on to heat the liquid passing through the return pipe. Thus, a temperature of the liquid in the inner tank was raised at 100° C.

At last, the return pump and the heater were stopped. Following thereto, a wafer was immersed into the inner tank so as to remove a resist adhering to the wafer therefrom by the mixture liquid of the sulfuric acid and the hydrogen peroxide solution. FIG. 9(b) shows a condition of residues of a resist on the wafer which had been immersed in the mixture liquid in the inner tank and was taken up therefrom.

As described above, a peroxomonosulfuric acid is generated by mixing a sulfuric acid and a hydrogen peroxide solution. However, a method of directly measuring an amount of the peroxomonosulfuric acid has not been established yet. Thus, the following method is generally carried out. Namely, a wafer to which a resist adheres is immersed in a mixture liquid of a sulfuric acid and a hydrogen peroxide solution in which a peroxomonosulfuric acid is contained, and a relative amount of the peroxomonosulfuric acid is estimated based on a degree of removal of the resist.

As described above, FIG. 9(a) and FIG. 9(b) show the conditions of the residual resist on the cleaned wafers of the Present Example and the Comparative Example. In the drawings, the black particles depict residues of the resist. When FIG. 9(a) and FIG. 9(b) are compared to each other, it can be understood that an amount of the resist (an amount of the residual resist) remaining on the wafer of the Present Example is significantly smaller than that of the wafer of the Comparative Example. That is to say, as compared with the chemical-liquid mixing method of the Comparative Example, it can be seen that the chemical-liquid mixing method of the Present Example can remove a larger amount of the resist when the wafer is immersed in the mixture liquid. Therefore, it was found that a peroxomonosulfuric acid that is effective in removing a resist from a substrate can be sufficiently generated with the use of the chemical-liquid mixing method and the chemical-liquid mixing apparatus of the Present Example.

The invention claimed is:

1. A chemical-liquid mixing apparatus for mixing a sulfuric acid and a hydrogen peroxide solution, the apparatus comprising:
   an inner tank;
   an outer tank disposed around the inner tank, into which outer tank a liquid overflowing from the inner tank flows;
   a return pipe configured to return the liquid in the outer tank to the inner tank; and
   a return pump provided on the return pipe for sending the liquid in the outer tank to the inner tank;
   a heater provided on the return pipe;
   a sulfuric-acid supply unit configured to supply a sulfuric acid into the inner tank;
   a hydrogen-peroxide-solution supply unit configured to supply a hydrogen peroxide solution to the inner tank or the outer tank;

a hydrogen-peroxide-solution replenishing pipe for replenishing a hydrogen peroxide solution that extends through the outer tank to reach an inside of the return pipe such that a hydrogen peroxide solution can be directly fed into the return pipe, with an outlet of the replenishing pipe downstream in the return pipe from an inlet of the return pipe; and a controller configured to control the sulfuric-acid supply unit, the hydrogen-peroxide-solution supply unit, and the return pump, the controller controlling at first the sulfuric-acid supply unit to fill the inner tank with a sulfuric acid, allowing the sulfuric acid overflowing from the inner tank to flow into the outer tank, then the controller controlling the hydrogen-peroxide-solution supply unit to supply a hydrogen peroxide solution into the inner tank or the outer tank, allowing the hydrogen peroxide solution to flow into the outer tank whereby the two kinds of liquids of the hydrogen peroxide solution and the sulfuric acid are stored in the outer tank, and the controller activating the return pump simultaneously with a start of an activation of the hydrogen-peroxide-solution supply unit.

2. The chemical-liquid mixing apparatus according to claim 1, wherein the controller is operable to control the heater such that the heater is activated after a preset period of time has passed from the activation of the return pump.

3. The chemical-liquid mixing apparatus according to claim 1, wherein the replenishing pipe is configured to supply hydrogen peroxide solution to the return pipe with the supplied hydrogen peroxide solution being received at the return pipe without first passing through the inner tank.

4. The chemical-liquid mixing apparatus according to claim 3, wherein the replenishing pipe is configured to supply hydrogen peroxide solution to the return pipe with the supplied hydrogen peroxide solution being received at the return pipe without first contacting a liquid in the outer tank.

5. The chemical-liquid mixing apparatus according to claim 1, wherein the replenishing pipe is configured to supply hydrogen peroxide solution to the return pipe with the supplied hydrogen peroxide solution being received at the return pipe without first contacting a liquid in the outer tank.

\* \* \* \* \*